(12) United States Patent
Tateishi

(10) Patent No.: US 6,410,969 B1
(45) Date of Patent: Jun. 25, 2002

(54) THIN FILM TRANSISTOR AND METHOD OF MANUFACTURING THE SAME

(75) Inventor: Yoshinori Tateishi, Ohkubocho (JP)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/913,188

(22) PCT Filed: Dec. 8, 2000

(86) PCT No.: PCT/EP00/12385

§ 371 (c)(1),
(2), (4) Date: Aug. 9, 2001

(87) PCT Pub. No.: WO01/43180

PCT Pub. Date: Jun. 14, 2001

(30) Foreign Application Priority Data

Dec. 10, 1999 (JP) ............................................. 11-351416

(51) Int. Cl.[7] ..................... H01L 31/0232; H01L 29/04; H01L 31/20; H01L 31/036; H01L 31/0376

(52) U.S. Cl. ........................... 257/435; 257/59; 257/72; 257/350

(58) Field of Search ........................... 257/59, 72, 350, 257/435

(56) References Cited

U.S. PATENT DOCUMENTS 5,624,861 A * 4/1997 Shibuya ...................... 438/164
6,236,063 B1 * 5/2001 Yamazaki et al. ............. 257/59
6,335,540 B1 * 1/2002 Zhang ......................... 257/53

FOREIGN PATENT DOCUMENTS

| JP | 622244  | 3/1994  | ......... H01L/21/336 |
| JP | 131021  | 5/1995  | ......... H01L/29/786 |
| JP | 2719690 | 11/1997 | ........... C30B/31/22 |

* cited by examiner

Primary Examiner—Ngân V. Ngô

(57) ABSTRACT

For the object of reducing a burden of TFT manufacturing process and a manufacturing cost, a thin film transistor is manufactured by means of the following steps: (i) a first deposition step of depositing a light shield film (3) on a substrate (1, 2); (ii) a second deposition step of depositing a semiconductor film (4) for forming a channel of the transistor on the light shield film (3); (iii) a patterning step of shaping the light shield film (3) and the semiconductor film (4) simultaneously into the same shape pattern; (iv) an electrode forming step of forming a source electrode (7) and a drain electrode (8) which are respectively in contact with both end-portions of the shaped semiconductor film (4); (v) a step of forming an insulator film (9) so that the insulator film (9) covers the source and drain electrodes (7, 8), and the semiconductor film (4); and (vi) a step of forming a gate electrode (10) at a location on the insulator film (9), corresponding to the semiconductor film (4). The light shield film (3) and the semiconductor film (4) are simultaneously shaped into the same shape pattern without individual dedicated masking, photoresist coating and etching processes.

5 Claims, 8 Drawing Sheets

THIN FILM TRANSISTOR AND METHOD OF MANUFACTURING THE SAME

BACKGROUND OF THE INVENTION

1. Field of the Invention

This invention relates to a thin film transistor (TFT) and a method of manufacturing the same, and more particularly to a TFT suitably used in an active matrix type liquid crystal display device and its manufacturing method.

2. Description of the Prior Art

The thin film transistor is generally used in electronic devices such as the liquid crystal display device (LCD) and a large area image sensor. Specifically, the TFT having source and drain electrodes, a gate electrode, and a channel region has been used as an element applying a voltage responsive to image information to a pixel electrode in an active matrix type liquid crystal display panel. In a transmissive active matrix LCD, a light shield film is provided for every TFT of such structure in order to prevent light from a backlight system or the like arranged on the side of a back face of the display panel from entering into the TFT, especially into a channel region thereof.

For instance, even when the TFT is controlled in a complete OFF condition, a degree of insulation between the source and the drain may be degraded to generate a leakage current if light impinges on the channel region. For this reason, an electric potential of the pixel electrode connected with the drain fluctuates unnecessarily, so that a deterioration of displayed-image quality is caused. In order to prevent such leakage current, the light shield film covering the channel region is formed on the side of the backlight system of the liquid crystal display panel, whereby a countermeasure that light can not impinge on the channel region has been taken.

In a method of manufacturing a TFT described in Japanese Laid-open Patent Application No.131021/95, a silicon film doped with phosphorus (P), which is to be the light shield film is made on a glass substrate, and a silicon oxide film is made on the upper surface of the P-doped silicon film. Subsequently, an amorphous silicon film which is to be the source, the drain and the channel region in a subsequent process is made on an upper surface of the silicon oxide film. Furthermore, the silicon oxide film and an aluminum film are made on the upper surface side in order. Subsequently, an insular-laminated portion consisting of the aluminum film, the silicon oxide film and the amorphous silicon film is formed by a patterning process comprising a resist process (a masking process) and an etching process, the insular-laminated portion being narrower than the other films. Ions of nitrogen are then implanted into portions of the silicon oxide film and the phosphorus-doped silicon film in an area except for the laminated portion. Subsequently, an annealing process is performed only to the ion-implanted portions in the silicon oxide film and the silicon film doped with phosphorus to nitride them so as to make them transparent.

The well-known method of manufacturing the TFT provides an optically-transparentizing process for the desired portions as mentioned above, as well as it makes the phosphorus-doped silicon film on the under side of the laminated portion into a light shield film. The amorphous silicon film functioning as a channel region can not receive the light from an outer surface side of the glass substrate because the incidence of the light is shielded by the light shield film. Therefore, it is possible to prevent light from a backlight system from impinging on the finished channel region to generate a leakage current as mentioned above.

However, in such a prior art, there has been another aspect that the masking process using a dedicated photoresist mask for making the light shield film and subsequent exposing process and etching process or the like are required for the patterning process of exclusively forming the light shield film, whereby the burden on the manufacturing process of TFTs is heavy. For this reason, it has been disadvantageous from the viewpoint of especially the manufacturing cost.

SUMMARY OF THE INVENTION

In view of the circumstances mentioned above, the object of the invention is to provide a thin film transistor and a method of manufacturing the same which can reduce the burden on the manufacturing process and require an inexpensive manufacturing cost.

To this end, a thin film transistor in one aspect of the invention comprises a source electrode, a drain electrode and a gate electrode, the transistor further comprising: a light shield film formed on a substrate; and a semiconductor channel region formed on the light shield film, the region being shaped as same as the light shield film, the source electrode and the drain electrode being located on both sides of the light shield film and channel region in contact with the channel region.

According to this construction, it is possible to pattern and form the light shield film in the same shape as and simultaneously with the channel region on the common manufacturing stage. Therefore, commonality of a step of forming the light shield film and a step of forming the channel region can lead to simplification of the TFT manufacturing process and to an inexpensive manufacturing cost.

In the thin film transistor, the source electrode and the drain electrode may be formed in contact with both end-portions of an upper surface of the channel region, respectively.

The light shield film may consist of semiconductor or insulator. This choice of material can yield a light shield film suitable to the construction of the invention.

In addition, the source electrode and drain electrode are preferably in ohmic contact with the channel region. Such ohmic contact allows the source and drain to touch the channel region at a low contact-resistance.

A display device of the other aspect of the invention, uses a thin film transistor comprising a source electrode, a drain electrode and a gate electrode, the thin film transistor comprising: a light shield film formed on a substrate; and a channel region of semiconductor formed on the light shield film, the region being shaped as same as the light shield film.

A method of manufacturing a thin film transistor, according to the other aspect of the invention, comprising: a first deposition step of depositing a light shield film on a substrate; a second deposition step of depositing a semiconductor film for forming a channel of the transistor on the light shield film; a patterning step of shaping the light shield film and the semiconductor film simultaneously into the same shape pattern; an electrode forming step of forming a source electrode and a drain electrode which are respectively in contact with both end-portions of the shaped semiconductor film; a step of forming an insulator film so that the insulator film covers the source and drain electrodes, and the semiconductor film; and a step of forming a gate electrode at a location on the insulator film, corresponding to the semiconductor film.

In the method, an ohmic contact treatment step may be performed for doping a surface layer portion of the semiconductor film with phosphorus after the second deposition step and before the patterning step.

The patterning step may include a process for masking stacked layers of the light shield film and the semiconductor film by using a single mask.

After the electrode forming step an insulation treatment step may be performed for nitriding or oxidizing a surface layer portion of the semiconductor film which is not covered with the source electrode and the drain electrode.

DESCRIPTION OF THE PREFERRED EMBODIMENT(S)

Figure 1:
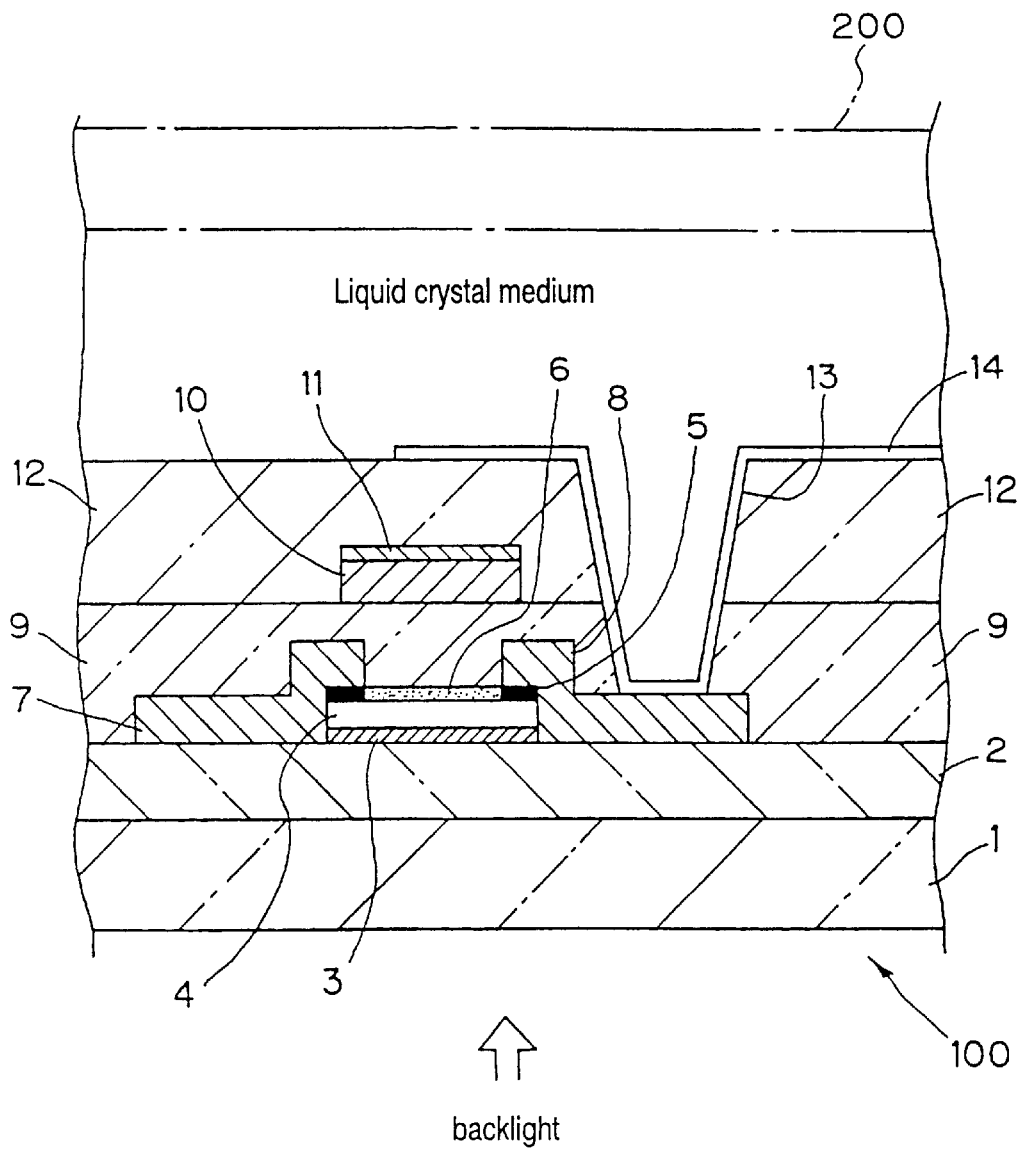
FIG. 1 is a partial sectional view of one substrate assembly of a display panel, showing a structure of a thin film transistor of a first embodiment according to the invention.

FIG. 1 shows a cross sectional structure of a TFT (thin film transistor) according to a first embodiment of the present invention.

With reference to FIG. 1, this TFT is used in a display panel for a transmissive liquid crystal display device of an active matrix type. Although a liquid crystal medium performing optical modulating action for image displaying is enclosed between two sheets of assemblies 100 and 200 based on the glass substrate respectively, the TFT is formed on the glass substrate 1 in the one assembly 100. The backlight transmits the glass substrate 1, a part of the TFT formed on the upper surface thereof and a pixel electrode to be incident on the liquid crystal medium and undergoes such optical modulating action to be introduced to an outside of a display screen through the other assembly 200.

An insulating film 2 consisting of silicon nitride SiNx is formed on the upper surface of the glass substrate 1, that is, on a surface of the side of the liquid crystal medium as a foundation layer. A light shield film 3 is formed on the upper surface of the insulating film 2, the film 3 consisting of a semiconductor such as pure Si, an insulator, or a semiconductor close to an insulator which can not transmit light through itself. Moreover, an amorphous silicone a-Si film 4 with the same shape as the light shield film 3 is formed on the upper surface of the light shield film 3. Furthermore, an n-type semiconductor $n^+$a-Si film (an outermost layer portion) 5 obtained by implanting phosphorus (P) into a-Si is formed on the ends of both sides of the upper surface portion of the a-Si film 4 in order to reduce contact-resistance respectively. In a central portion (a dotted portion in FIG. 1) of the a-Si film 4, a SiNx film (the outermost layer portion) 6 is formed as an insulating layer, the SiNx film 6 being obtained by giving additional $NH_3$ process, that is, nitriding process on $n^+$a-Si. $SiO_2$ based on an oxidizing process may be used as the insulating film 6 instead of SiNx.

On the upper surface of the insulating film 2, the source and drain electrodes 7 and 8 are made from, for example, molybdenum Mo respectively in the both sides opposite to each other of the three-step-structure of the layers 3 to 6. It is noted that, although being not shown in the Figure, the source electrode 7 is connected to a source bus running in an effective display region of the display panel. The source and drain electrodes 7 and 8 are respectively arranged to overhang the corresponding upper surface portions of the $n^+$a-Si film 5. In other words, the electrodes 7 and 8 hang over in such a manner that each part of them covers over the corresponding portion and makes contact with it. Therefore, each of the source electrode 7 and the drain electrode 8 is in ohmic contact with the a-Si film 4 in the condition of interposing the $n^+$a-Si film 5. Moreover, the side of the source electrode 7 and the side of the drain electrode 8 in the three-step structure are insulated through the SiNx film 6 for which $NH_3$ process is performed as an insulating process. The source electrode 7, the drain electrode 8 and the a-Si film 4 connecting therebetween mainly form an active region with a predetermined shape (island-shape).

The silicon nitride SiNx film 9 is formed as a gate insulating film on the upper surface of the insulating film 2 in such a manner as to cover the three-layered structure including SiNx film 6, the source 7 and the drain 8 except for a part. Moreover, a gate electrode 10 consisting of, for example, an aluminum alloy is formed at the position corresponding to the a-Si film 4 on the upper surface of the silicon nitride SiNx film 9. The so called cap layer 11 for the gate consisting of, for example, molybdenum (Mo) is formed over the upper surface of this gate electrode 10. This cap layer 11 is for improving the connectability to another aluminum wiring (not shown). The gate electrode 10 and the cap layer 11 also run over the effective display region of the display panel as gate bus lines.

A SiNx film 12 is formed as an insulating film on the upper surface of the silicon nitride SiNx film 9 in such a manner as to cover the gate electrode 10 and the cap layer 11. However, the SiNx film 9 and 12 are not formed on/above a part of the drain electrode 8. Namely, a contact hall 13 to the drain electrode 8 is formed in the SiNx films 9 and 12 as shown in FIG. 1. In addition, a pixel electrode 14 consisting of e.g., ITO (indium-tin oxide) as a transparent electrode, which extends from the top surface of the SiNx film 12 along a wall of the contact hall 13 so as to be connected with the drain electrode 8.

It is noted that the above-mentioned n$^+$a-Si film 5 can be formed by the art of process disclosed in Japanese Patent Publication No. 22244/94 and Japanese Patent No. 2719690. It is also noted that description of the alignment layer of the liquid crystal medium and the like are formed on the side of the upper surface of the pixel electrode 14 will be omitted for the sake of clarity of the invention herein.

Figure 2:
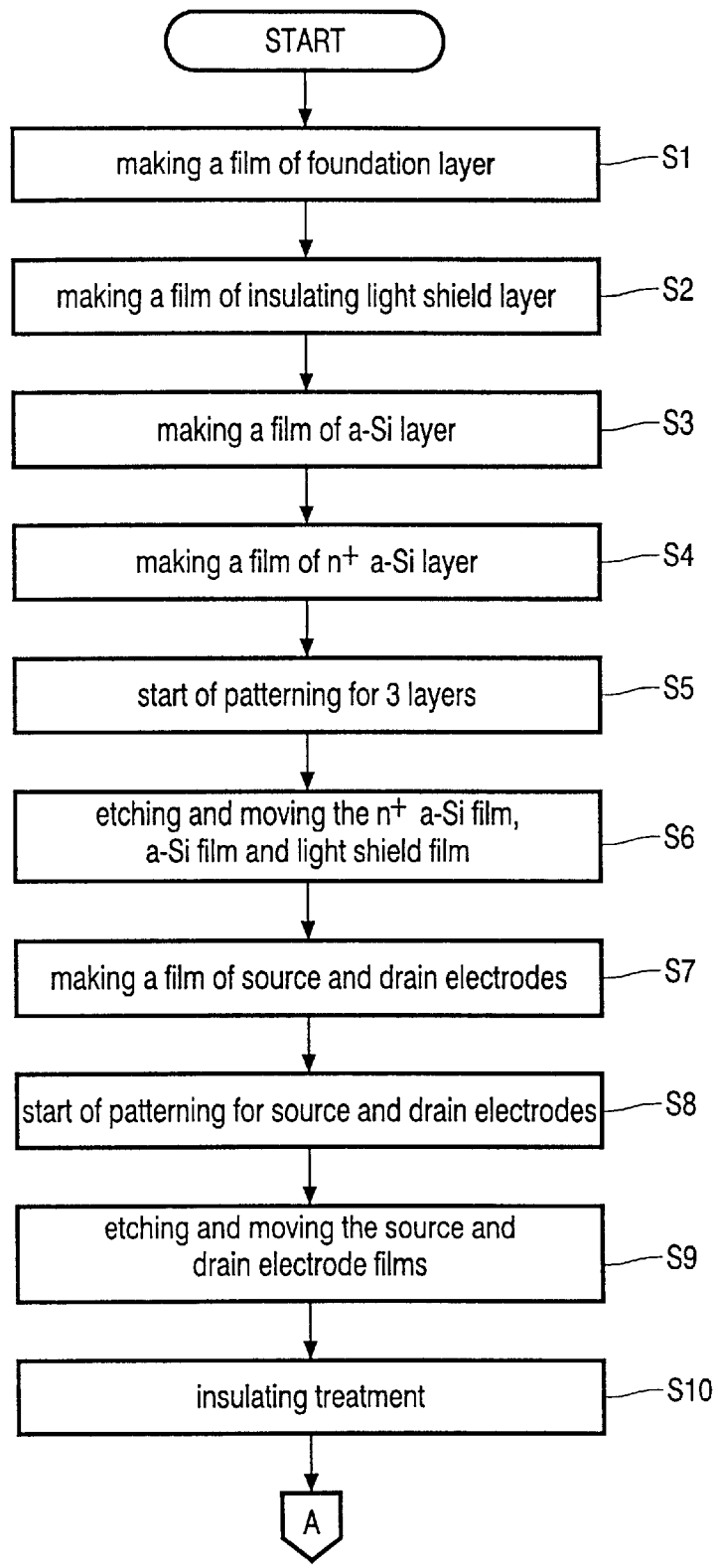
FIG. 2 is a flow chart showing a procedure in the first half of process of the method of manufacturing TFTs of FIG. 1.
Figure 3:
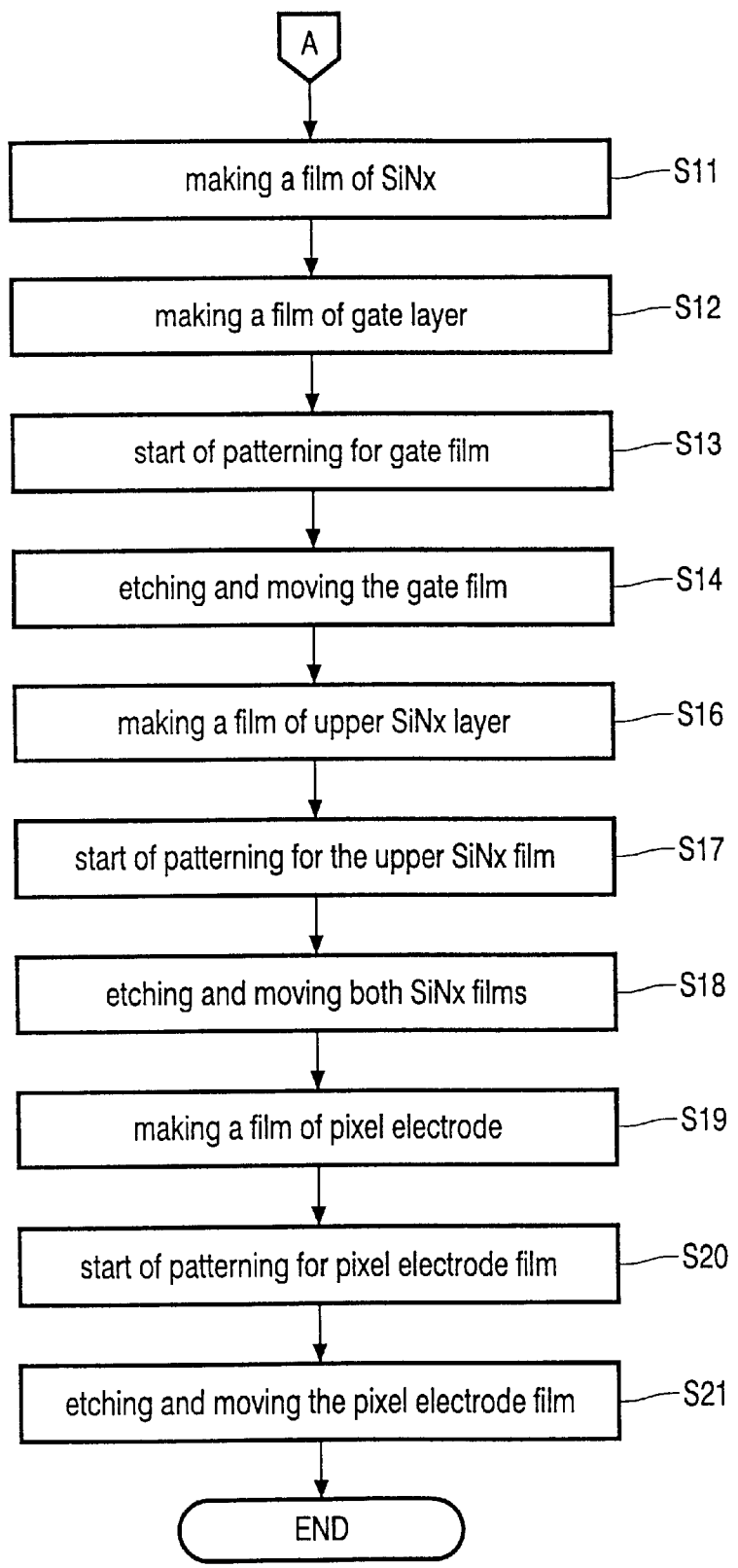
FIG. 3 is a flow chart showing a procedure in the second half of process of the method of manufacturing TFTs of FIG. 1.

Next, a method of manufacturing the thin film transistor of the structure shown in FIG. 1 will be described. FIGS. 2 and 3 show a procedure of the method of manufacturing the same, and FIGS. 4 to 9 show a cross section of the TFT structure in each process of the method of manufacturing the TFT.

Figure 4:
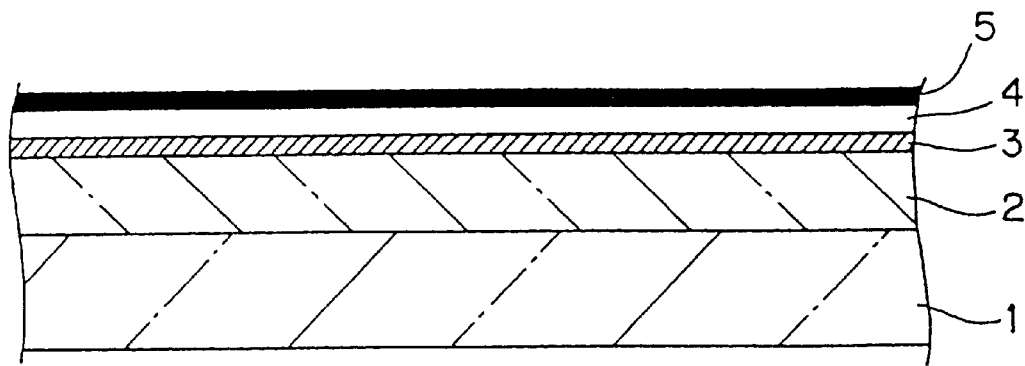
FIG. 4 is a partial sectional view showing a configuration on the way of the thin film transistor on one manufacturing stage of the flow in FIGS. 2 and 3.

In FIG. 2, first of all, the insulating film 2 as a foundation layer consisting of SiNx is made on the upper surface of the glass substrate 1 as shown in FIG. 4 (Step S1). Subsequently, the light shield film 3 consisting of the semiconductor typically represented by pure Si, the insulator, or the semiconductor close to insulator is made by sputtering over the upper surface of the insulating film 2 (Step S2). After that, the amorphous silicone, a-Si film 4 is made on the upper surface of the light shield film 3 by e.g., a plasma CVD (chemical-vapor deposition) method (Step S3). Furthermore, phosphorus-doping is performed from the upper surface of the a-Si film 4 so that the n$^+$a-Si film 5 is formed in an outermost layer portion of the a-Si film 4 (Step S4).

Figure 5:
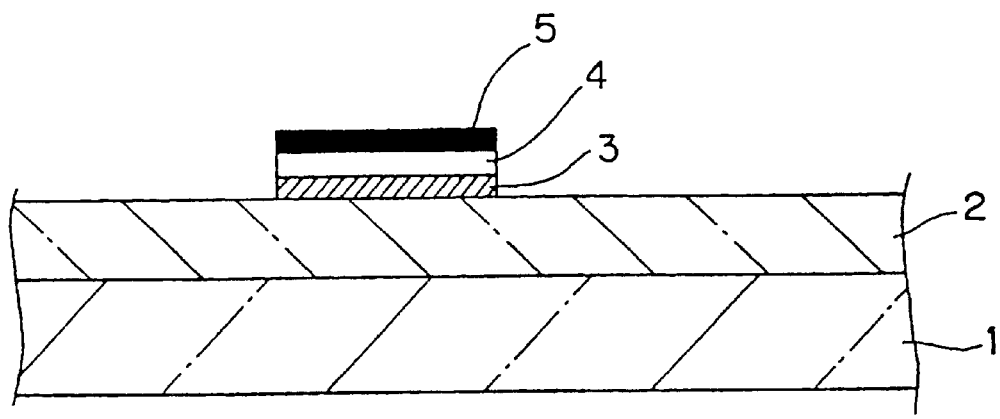
FIG. 5 is a partial sectional view showing a configuration on the way of the thin film transistor on the subsequent manufacturing stage of the flow in FIGS. 2 and 3.

Next, pattering for the three layers 3, 4 and 5 is started using a photoresist mask on the upper surface of the n$^+$a-Si film 5 (Step S5). Step S5 includes not only an exposure process but also a masking process using such a mask. Subsequently, an etching-removing process for the n$^+$a-Si film 5, the a-Si film 4 and the light shield film 3 is performed at the same time (Step S6). As a result of this, three-layered structure consisting of the n$^+$a-Si film 5, the a-Si film 4 and the light shield film 3 is formed in the same shape (insular shape) as shown in FIG. 5.

Figure 6:
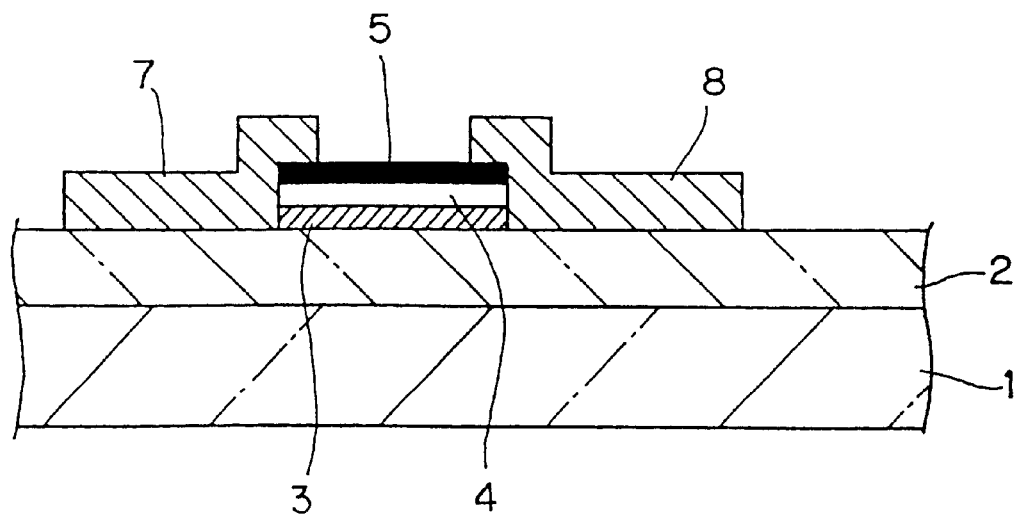
FIG. 6 is a partial sectional view showing a configuration on the way of the thin film transistor on the further subsequent manufacturing stage of the flow in FIGS. 2 and 3.
Figure 7:
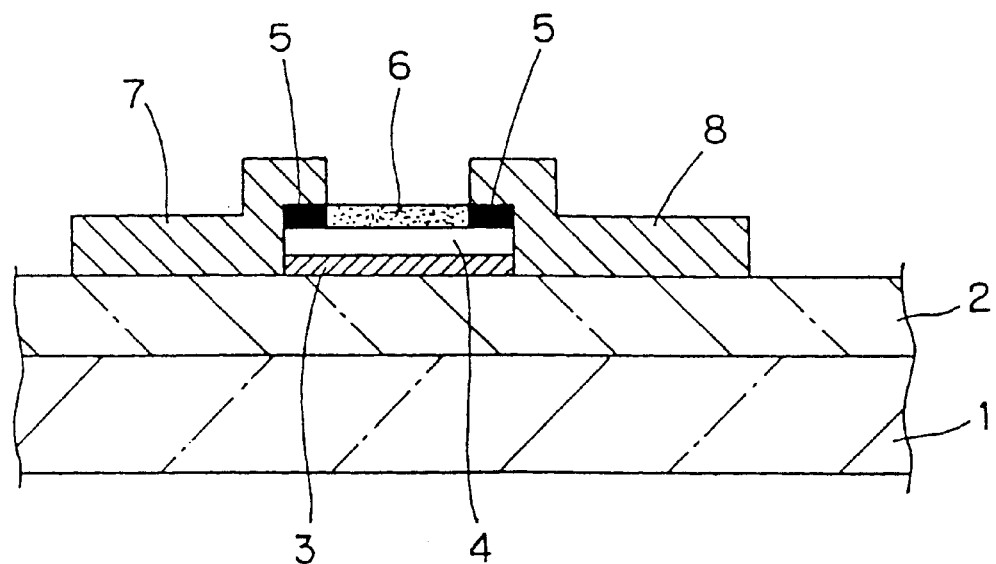
FIG. 7 is a partial sectional view showing a configuration on the way of the thin film transistor on the yet further subsequent manufacturing stage of the flow in FIGS. 2 and 3.

After that, a conductive film consisting of, for example, molybdenum Mo which is to be the source electrode and the drain electrode is made over the upper surface of the insulating film 2 by sputtering or the like so as to bury this three-layered structure (step S7). Subsequently, the conductive film is subjected to patterning and etching-removing so that the source electrode and the drain electrode are formed (Steps S8 and S9). As a result, the source and drain electrodes 7 and 8 is finished in a form that the electrodes 7, 8 is in contact with both ends of the three-layered structure consisting of the n$^+$a-Si film 5, the a-Si film 4 and the light shield film 3, as shown in FIG. 6. In this case, the source and drain electrodes 7 and 8 take a form of overhanging and touching both side portions of the upper surface of the n$^+$a-Si film 5.

Subsequently, ions of nitrogen are implanted into the central portion of the upper surface of the n$^+$a-Si film 5, and an annealing process is given to finish nitriding, so that an insulating treatment is achieved (Step S10). As a result of this, only a part of n$^+$a-Si film 5 which is not covered by the source and drain electrodes 7 and 8 is nitrided, whereby the insulating film 6 is formed. It is noted that oxidation may be applied instead of nitriding.

Figure 8:
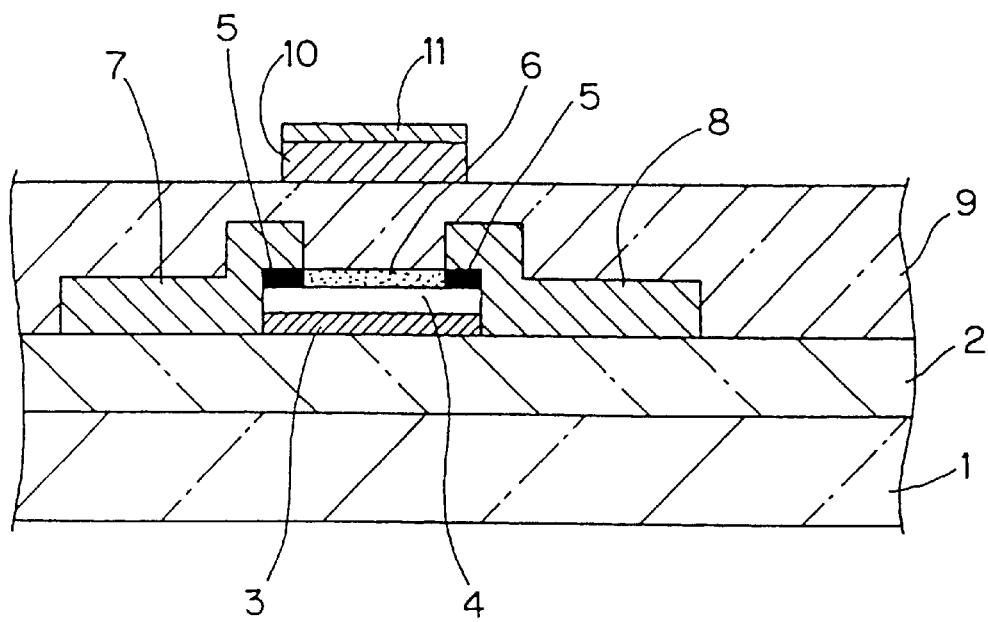
FIG. 8 is a partial sectional view showing a constitution form on the way of the thin film transistor in the further advanced manufacturing process of the flow in FIGS. 2 and 3.

Furthermore, advancing to FIG. 3 in the flow chart, the SiNx film 9 to be an insulating layer is made on the upper surface of the insulating film 2 in such a manner as to cover the source and drain electrodes 7 and 8 as well as the insulating film 6 as shown in FIG. 8 (Step S11).

Subsequently, the aluminum film and the molybdenum (Mo) cap layer which are to be a gate electrode and bus wiring, respectively, is made over the upper surface of the SiNx film 9 in succession by e.g. sputtering (Step S12). Then, these aluminum film and Mo-layer are patterned and partially etching-removed so that the gate electrode with appropriate shape and position is formed (Steps S13 and S14). As a result, the gate electrode 10 and the cap layer 11 are formed at the position corresponding to the a-Si film 4 as shown in FIG. 8.

Figure 9:
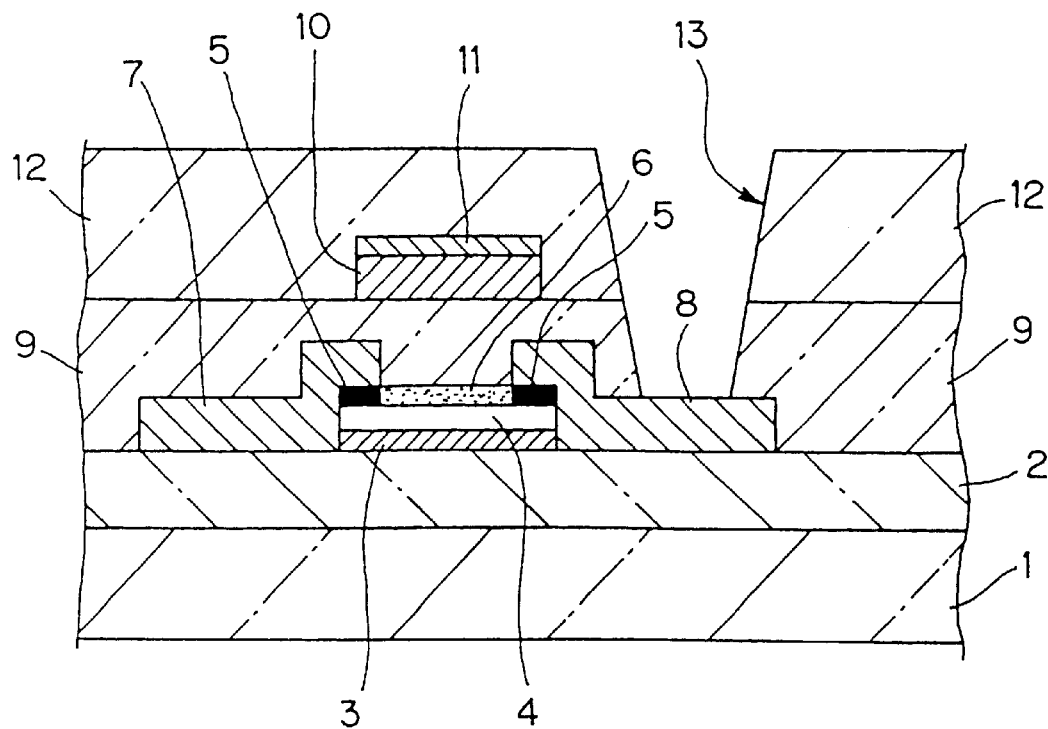
FIG. 9 is a partial sectional view showing a constitution form on the way of the thin film transistor in the yet further advanced manufacturing process of the flow in FIGS. 2 and 3.

Next, an upper side SiNx film 12 to be an further insulating layer is made over the upper surface of the SiNx film 9 in such a manner as to cover the gate electrode and the cap layer 10 and 11 (Step S16). Moreover, the lower and upper sides SiNx films 9 and 12 are patterned and the etching-removing process is performed in order to form the contact hall serving to connect the pixel electrode to the drain electrode 8 (Steps S17 and S18). As a result, the contact hall 13 is formed in the SiNx films 9 and 12 as shown in FIG. 9.

After that, the ITO (indium-tin-oxide) film for forming the pixel electrode corresponding to a pixel of the display panel is made in a predetermined thickness over a wall surface of the contact hall 13 and the upper surface of the SiNx film 12 (Step S19). Then, this ITO film is patterned and partially etching-removed in order to form the pixel electrodes with appropriate shape and position (Steps S20 and S21). As a result, there is formed the pixel electrode 14 being in contact with the drain electrode 8 in the contact hall 13 and extending to the upper surface of the SiNx film 12 as shown in FIG. 1.

As described above, according to this embodiment, the light shield film shielding irradiation of light to the channel region is patterned at the same time by a common process in the same shape as the channel region, when patterning the channel region between the source and drain electrodes 7 and 8 into a predetermined shape. Therefore, since the process of forming the light shield film is made common to the other process, a TFT manufacturing process can be simplified, whereby an inexpensive manufacturing cost is required. More specifically, a dedicated masking process for the light shield film can be cut back.

Moreover, there has been another aspect, as an additional advantage, that since the light shield film and the channel region are formed by the same mask, both of them are formed exactly in the same shape, whereby the possibility that the light shield film fails to cover the channel region can be decreased significantly, thereby to contribute to prevention of generation of the leakage current mentioned above.

Furthermore, there is also the advantage that the embodiment of the invention has little limitation of a film-making temperature for the channel region since the source and the drain are formed after forming the channel region.

Moreover, although the thin film transistor constituting a driving circuit for one pixel has been described in the first embodiment, the thin film transistor having an independent channel region is formed in a form of matrix in a correspondence with each pixel of the liquid crystal display device.

Next, a second embodiment according to the invention will be described with reference to FIG. 10. The same components as those in the first embodiment shown in FIG. 1 are shown with the same reference characters in FIG. 10.

Figure 10:
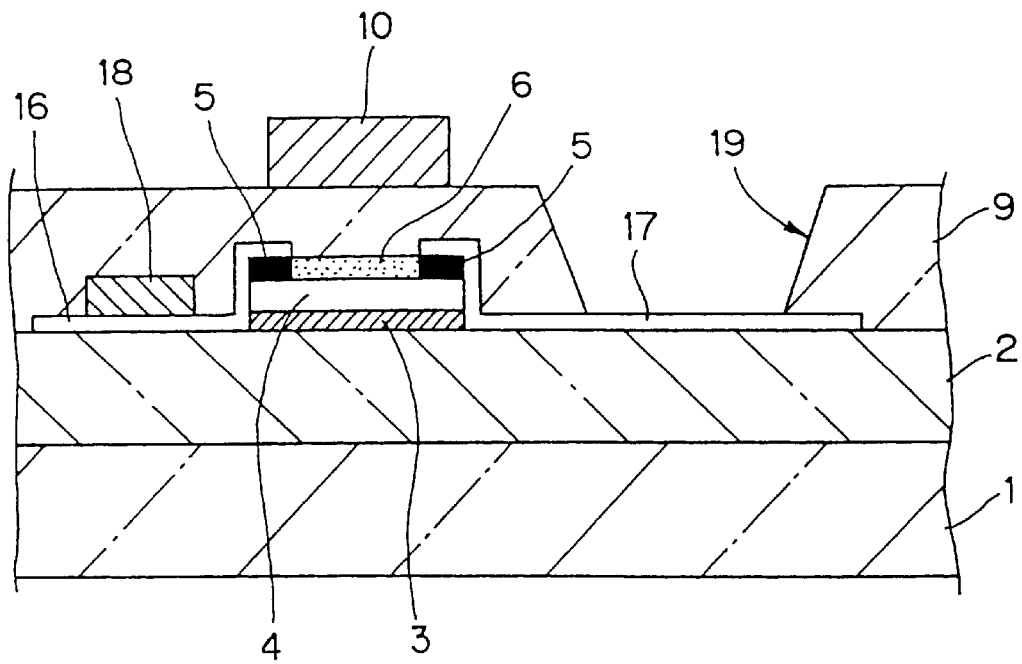
FIG. 10 is a partial sectional view of one substrate assembly of a display panel, showing an arrangement of a thin film transistor of a second embodiment according to the invention.

In FIG. 10, the layers of the light shield film 3, the a-Si film 4, the n+a-Si film 5 and the SiNx film 6 deposited in this order are formed on the insulating film 2 formed on the upper surface of the glass substrate 1 in the same shape, as explained in the first embodiment. A process of this manufacturing is also the same as the first embodiment.

Moreover, there is provided a structure that the source and drain electrodes 16 and 17 consisting of ITO respectively hang over the end of the upper surface of the n+a-Si film 5 to be in contact therewith. Therefore, also in this case, the source and drain electrodes 16 and 17, and the a-Si film 4 interpose n+a-Si film 5 respectively, so that ohmic contact is made. Moreover, the sides of the source and drain electrodes 16 and 17 are insulated by the SiNx film 6 having undergone an $NH_3$ process.

A wiring pattern 18 forming a source bus is formed by molybdenum (Mo) on the source electrode 16. Moreover, the insulating film 9 of SiNx, having undergone nitriding is formed in such a manner as to cover the source electrode 16 and the drain electrodes 17 except its certain part, the SiNx film 6 on which the insulating process is given, and the wiring pattern 18. A contact hall 19 is formed in such a manner as to expose a part of the drain electrode 17. Moreover, the aluminum film 10 is formed at a position corresponding to the a-Si film 4 on the upper surface of the insulating film 9.

Therefore, the light shield film shielding irradiation of light to the channel region is patterned at the same time by the common process in the same shape as the channel region, when the channel region between the source and drain electrodes 16 and 17 is patterned into a predetermined shape, in the same manner as the first embodiment. Therefore, this second embodiment can also have the same effect as the first embodiment described above.

However, as shown in FIG. 10, the second embodiment is arranged to enable the drain electrode 17 to directly function as a pixel electrode, whereby the layer corresponding to the ITO 14 of FIG. 1 in the first embodiment is not required to form.

Next, a path of a current flowing from the source electrode to the drain electrode through the channel region will be described for the first and second embodiments.

Figure 11:
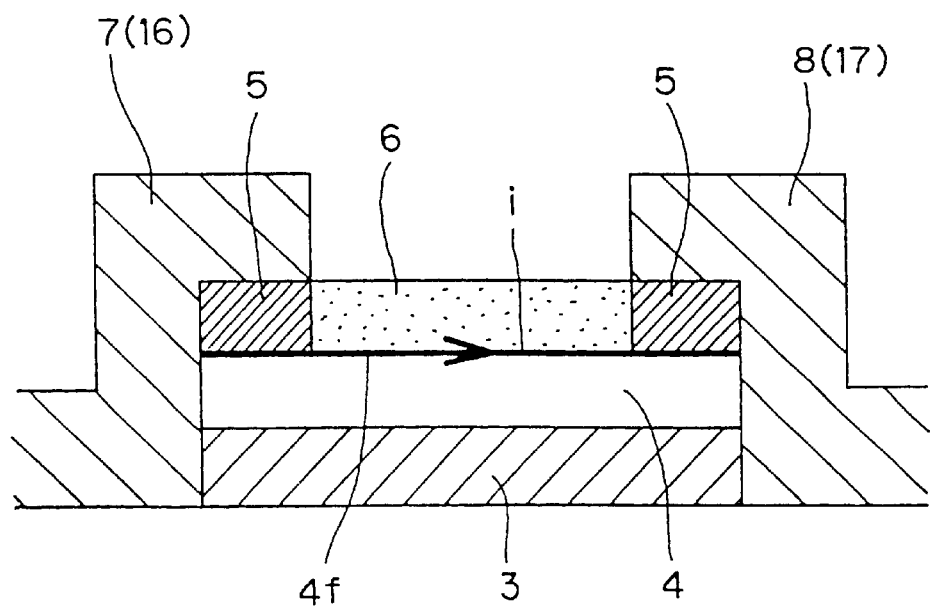
FIG. 11 is an enlarged sectional part-view showing a current path between a source and a drain of the thin film transistor in the first and second embodiments.

FIG. 11 shows a state of the current flowing in the channel region. When the TFT is in an ON condition, the current "i" flowing from the source electrode 7 (or 16) to the drain electrode 8 (or 17) can flow in a surface 4f on a side of the gate, the surface having the lowest resistance in the a-Si film 4 constituting the channel region. In this case, the source and drain electrodes are linearly in contact with both ends of the surface of the a-Si film 4 respectively as shown in FIG. 11. As a result, it takes a structure that the current path (channel) in the a-Si film 4 is formed linearly and with the shortest distance between the source and drain electrodes.

Figure 12:
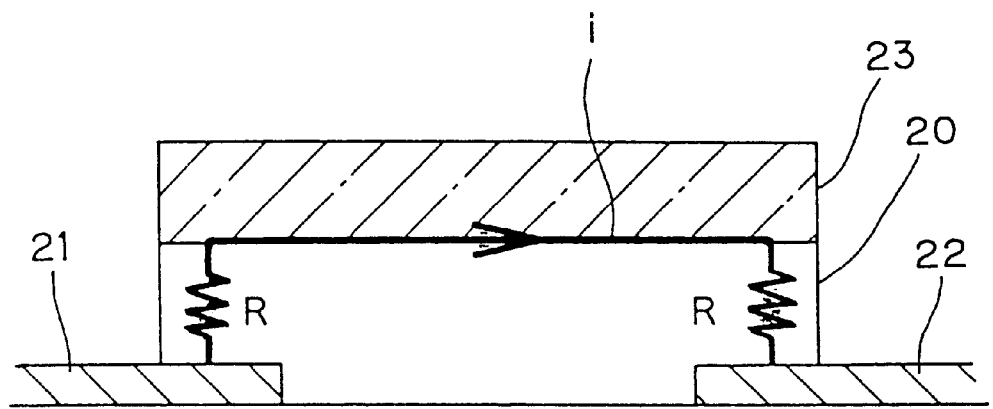
FIG. 12 is an enlarged sectional part-view showing a current path between a source and a drain of the thin film transistor having a configuration different from that of the first and second embodiments.

On the other hand, in a structure of a thin film transistor as shown in FIG. 12, an a-Si film 20 forming a channel region is formed on surfaces of ends of the source and drain electrodes 21 and 22. Moreover, an insulating film 23 is formed on the upper surface of the a-Si film 20. In the case of such structure, the current "i" flowing from the source electrode 21 to the drain electrode 22 has a path in which the current is directed toward the surface of the gate side of the a-Si film 20 (upwardly, in the Figure) from the source electrode 21 through an inside of the a-Si film 20 and flows to the side of the drain electrode 22 through the surface of the a-Si film 20, and is directed toward the side of the drain electrode 22 (downwardly) to flow to the drain electrode 22 through an inside of the a-Si film 20 again.

Therefore, series resistances R due to a thickness of the a-Si film 20 are caused in the channel in the sides of the source and drain electrodes 21 and 22 as shown in FIG. 12. For this reason, an ON resistance of the thin film transistor becomes high.

Getting back to FIG. 11, in the embodiments according to the invention, the current flowing from the sauce electrode 7 (or 16) to the drain electrode 8 (or 17) can not flow inside the a-Si film 4 in the direction of the thickness but flows linearly in the surface portion of the gate side of the a-Si film 4. Therefore, the ON resistance of the thin film transistor can be minimized. Hence, the embodiments offer advantages that a driving efficiency for the pixel electrode can be improved and heat generation in the thin film transistor can be suppressed.

Although a transmission type liquid crystal display device has been described in the embodiments, the invention can not be necessarily limited to this type and it can be applied for a reflective type liquid crystal display device basically. In this case, the substrate 1 may be non-transparent, and the electrode 14 and more can be formed from optically reflective materials.

Moreover, although the constitution that the substrate having TFTs is arranged on the back side of the display panel has been described in the embodiments, the skilled person can realize a constitution that the substrate is arranged on the front side of the display panel.

What is claimed is:

1. A thin film transistor comprising a source electrode, a drain electrode and a gate electrode, the transistor further comprising:

a light shield film formed on a substrate; and a semiconductor channel region formed on the light shield film, the region being shaped as same as the light shield film, the source electrode and the drain electrode being located on both sides of the light shield film and channel region in contact with the channel region.

2. A thin film transistor according to claim 1, characterized in that the source electrode and the drain electrode are formed in contact with both end-portions of an upper surface of the channel region, respectively.

3. A thin film transistor according to claim 1, characterized in that the light shield film consists of semiconductor or insulator.

4. A thin film transistor according to claim 1, characterized in that the source electrode and drain electrode are in ohmic contact with the channel region.

5. A display device using a thin film transistor comprising a source electrode, a drain electrode and a gate electrode, the thin film transistor comprising: a light shield film formed on a substrate; and a channel region of semiconductor formed on the light shield film, the region being shaped as same as the light shield film.

* * * * *